US007884529B2

(12) United States Patent
Johnson et al.

(10) Patent No.: US 7,884,529 B2
(45) Date of Patent: Feb. 8, 2011

(54) DIAPHRAGM MEMBRANE AND SUPPORTING STRUCTURE RESPONSIVE TO ENVIRONMENTAL CONDITIONS

(75) Inventors: Kevin M. Johnson, Natick, MA (US); Matthew D. Abelson, Boylston, MA (US)

(73) Assignee: Emo LAbs, Inc., Waltham, MA (US)

( * ) Notice: Subject to any disclaimer, the term of this patent is extended or adjusted under 35 U.S.C. 154(b) by 1196 days.

(21) Appl. No.: 11/421,335

(22) Filed: May 31, 2006

(65) Prior Publication Data

US 2006/0269087 A1 Nov. 30, 2006

Related U.S. Application Data

(60) Provisional application No. 60/685,841, filed on May 31, 2005, provisional application No. 60/685,842, filed on May 31, 2005.

(51) Int. Cl.
*H01L 41/08* (2006.01)

(52) U.S. Cl. ........................ 310/324; 310/328; 310/346

(58) Field of Classification Search ................. 310/324, 310/328, 330–332, 346
See application file for complete search history.

(56) References Cited

U.S. PATENT DOCUMENTS

| | | | | |
|---|---|---|---|---|
| 3,509,387 | A * | 4/1970 | Thorn et al. | 310/324 |
| 3,544,201 | A * | 12/1970 | Schlafer et al. | 359/224.1 |
| 4,056,742 | A | 11/1977 | Tibbetts | 310/357 |
| 4,088,915 | A | 5/1978 | Kodama | 310/324 |
| 4,170,742 | A | 10/1979 | Itagaki et al. | 310/324 |
| 4,352,961 | A | 10/1982 | Kumada et al. | 455/350 |
| 4,454,386 | A | 6/1984 | Koyano | 179/110 |
| 4,578,613 | A | 3/1986 | Posthuma de Boer et al. | 310/311 |
| 4,593,160 | A | 6/1986 | Nakamura | 179/110 |
| 4,607,145 | A | 8/1986 | Ravinet et al. | |
| 4,625,138 | A | 11/1986 | Ballato | 310/320 |
| 4,638,207 | A | 1/1987 | Radice | 310/328 |
| 4,680,800 | A | 7/1987 | Bank et al. | 381/194 |
| 4,807,294 | A | 2/1989 | Iwata et al. | 380/190 |
| 4,864,624 | A | 9/1989 | Tichy | 381/55 |
| 4,969,197 | A | 11/1990 | Takaya | 381/190 |

(Continued)

FOREIGN PATENT DOCUMENTS

FR 2 649 575 1/1991

(Continued)

OTHER PUBLICATIONS

European Patent Office Search Report for European Application No. 01901776.3 dated Apr. 26, 2005, (6 pgs.).

(Continued)

*Primary Examiner*—Thomas M Dougherty
(74) *Attorney, Agent, or Firm*—Grossman, Tucker, Perreault & Pfleger, PLLC

(57) ABSTRACT

An acoustic transducer is disclosed that is capable of converting mechanical motion into acoustical energy may include a diaphragm and a support on one portion of the diaphragm. An actuator may then be provided that is operatively coupled to a second portion of the diaphragm. The support and actuator may be configured to be environmentally responsive to surrounding conditions of, e.g., heat and/or humidity which may then substantially maintain the diaphragm's acoustic performance.

15 Claims, 8 Drawing Sheets

U.S. PATENT DOCUMENTS

| | | | | |
|---|---|---|---|---|
| 4,979,219 | A | 12/1990 | Lin | 381/190 |
| 5,031,222 | A | 7/1991 | Takaya | 381/190 |
| 5,115,472 | A | 5/1992 | Park et al. | 381/152 |
| 5,193,119 | A | 3/1993 | Tontini et al. | 381/182 |
| 5,283,835 | A | 2/1994 | Athanas | 381/190 |
| 5,388,160 | A | 2/1995 | Hashimoto et al. | 381/71 |
| 5,428,832 | A | 6/1995 | Nohara et al. | 455/296 |
| 5,473,214 | A | 12/1995 | Hildebrand | 310/321 |
| 5,524,058 | A | 6/1996 | Moseley | 381/71 |
| 5,526,421 | A | 6/1996 | Berger et al. | 379/389 |
| 5,608,282 | A | 3/1997 | Wilber et al. | 505/211 |
| 5,615,270 | A | 3/1997 | Miller et al. | 381/57 |
| 5,638,454 | A | 6/1997 | Jones et al. | 381/71 |
| 5,638,456 | A | 6/1997 | Conley et al. | 381/190 |
| 5,642,332 | A | 6/1997 | Chang et al. | 367/165 |
| 5,652,801 | A | 7/1997 | Paddock | 381/190 |
| 5,676,612 | A | 10/1997 | Schellekens et al. | 474/18 |
| 5,684,884 | A | 11/1997 | Nakaya et al. | 381/190 |
| 5,705,878 | A * | 1/1998 | Lewis et al. | 310/328 |
| 5,711,058 | A | 1/1998 | Frey | 29/25.35 |
| 5,736,808 | A | 4/1998 | Szilagyi et al. | 310/322 |
| 5,751,827 | A | 5/1998 | Takahashi | 65/141 |
| 5,767,612 | A | 6/1998 | Takeuchi et al. | 310/324 |
| 5,780,958 | A | 7/1998 | Strugach et al. | 310/348 |
| 5,802,195 | A | 9/1998 | Regan et al. | 381/190 |
| 5,825,902 | A | 10/1998 | Fujishima | 381/190 |
| 5,828,768 | A | 10/1998 | Eatwell et al. | 381/333 |
| 5,856,956 | A * | 1/1999 | Toki | 367/160 |
| 5,867,302 | A | 2/1999 | Fleming | 359/291 |
| 5,901,231 | A | 5/1999 | Parrella et al. | 381/86 |
| 5,973,441 | A * | 10/1999 | Lo et al. | 310/330 |
| 5,977,688 | A | 11/1999 | Utsunomiya et al. | 310/316.01 |
| 6,003,766 | A | 12/1999 | Azima et al. | 235/379 |
| 6,023,123 | A | 2/2000 | Petiet | 310/316.01 |
| 6,028,389 | A | 2/2000 | Bernstein | 310/324 |
| 6,031,926 | A | 2/2000 | Azima et al. | 381/423 |
| 6,058,196 | A | 5/2000 | Heron | 381/152 |
| 6,060,811 | A | 5/2000 | Fox et al. | |
| 6,064,746 | A | 5/2000 | Nakamura | 381/351 |
| 6,144,746 | A | 11/2000 | Azima et al. | 381/152 |
| 6,151,402 | A | 11/2000 | Azima et al. | 381/396 |
| 6,181,797 | B1 | 1/2001 | Parrella et al. | 381/86 |
| 6,188,775 | B1 | 2/2001 | Azima et al. | 381/431 |
| 6,195,440 | B1 | 2/2001 | Warnaka et al. | 381/190 |
| 6,198,831 | B1 | 3/2001 | Azima et al. | 381/338 |
| 6,215,881 | B1 | 4/2001 | Azima et al. | 381/152 |
| 6,215,882 | B1 | 4/2001 | Heron | 381/152 |
| 6,215,884 | B1 | 4/2001 | Parrella et al. | 381/190 |
| 6,218,766 | B1 | 4/2001 | Warnaka et al. | 310/322 |
| 6,243,473 | B1 | 6/2001 | Azima et al. | 381/152 |
| 6,247,551 | B1 | 6/2001 | Heron | 181/173 |
| 6,278,790 | B1 | 8/2001 | Davis et al. | 381/398 |
| 6,437,485 | B1 * | 8/2002 | Johansson | 310/332 |
| 6,472,797 | B1 | 10/2002 | Kishimoto | 310/324 |
| 6,504,286 | B1 | 1/2003 | Porat et al. | 310/324 |
| 6,522,760 | B2 | 2/2003 | Azima et al. | 381/152 |
| 6,570,299 | B2 | 5/2003 | Takeshima et al. | |
| 6,720,708 | B2 | 4/2004 | Athanas | 310/324 |
| 6,720,709 | B2 | 4/2004 | Porat et al. | 310/324 |
| 6,844,657 | B2 * | 1/2005 | Miller et al. | 310/311 |
| 7,038,356 | B2 | 5/2006 | Athanas | 310/324 |
| 2006/0290236 | A1 * | 12/2006 | Ikehashi | 310/330 |
| 2009/0200896 | A1 * | 8/2009 | Morris et al. | 310/321 |

FOREIGN PATENT DOCUMENTS

| | | |
|---|---|---|
| GB | 1 369 241 | 10/1974 |
| JP | 04 140999 | 5/1992 |
| WO | WO 98/28942 | 7/1998 |

OTHER PUBLICATIONS

European Patent Office Supplementary European Search Report for European Application No. 01901776.3 dated Aug. 3, 2005 (6 pgs.).

European Patent Office Search Report for European Application No. 01901776.3 dated Nov. 2, 2005, (5 pgs.).

Harris, Neil, "The Distrubuted—Mode Loudspeaker (DML) as a Broad-Band Acoustic Radiator", Audio Engineering Society Preprint 4526 (D-6); Presented at the 103rd Convention Sep. 26-29, 1997, New York (5 pgs.).

Kugel, V.D., et al. Bimorph-based Piezoelectric Air Acoustic Transducer: Model. Sensors and Actuators A 69 (1998) 234-242. (9 pgs.).

* cited by examiner

DIAPHRAGM MEMBRANE AND SUPPORTING STRUCTURE RESPONSIVE TO ENVIRONMENTAL CONDITIONS

This application claims the benefit of U.S. Provisional Applications Ser. Nos. 60/685,841 and 60/685,842, both filed May 31, 2005, which are incorporated herein by reference. Reference is also made to U.S. application Ser. No. 11/421,345 entitled "Optimized Piezo Design For A Mechanical-To-Acoustical Transducer", filed simultaneously herewith, whose teachings are also incorporated by reference.

BACKGROUND OF THE INVENTION

Mechanical-to-acoustical transducers may have one actuator that may be coupled to a speaker membrane or diaphragm that may then be anchored and spaced from the actuator. Such a system may provide a diaphragm-type speaker where a display may be viewed through the speaker. The actuators may be electromechanical, such as electromagnetic, piezoelectric or electrostatic. Piezo actuators do not create a magnetic field that may then interfere with a display image and may also be well suited to transform the high efficiency short linear travel of the piezo motor into a high excusion, piston-equivalent diaphragm movement.

SUMMARY OF THE INVENTION

In a first exemplary embodiment, an acoustic transducer is disclosed that is capable of converting mechanical motion into acoustical energy that may include a diaphragm and a support on one portion of the diaphragm. An actuator may then be provided that is operatively coupled to a second portion of the diaphragm. The support and actuator may be separated by a distance and are capable of relative motion to adjust such distance in response to environmental changes, such as heat and/or humidity. The diaphragm, which may be formed from polymeric type material, may have some preformed level of curvature, which nominal level of curvature may be maintained by the environmentally responsive support/actuator configuration.

In another exemplary embodiment, the present invention relates to a method for compensating for environmental conditions in a transducer that is capable of converting mechanical motion into acoustical energy. The method includes supplying a transducer including a diaphragm and a support on one portion of the diaphragm including an actuator operatively coupled to a second portion of the diaphragm wherein the support and actuator are separated by a distance. The diaphragm and transducer may then be exposed to changes in environmental conditions such as temperature, in which case the diaphragm may undergo some level of expansion and/or contraction. In such case the actuator and support may self-adjust the distance between the actuator and support, in which case audio output of the diaphragm may not be substantially compromised.

DETAILED DESCRIPTION

A mechanical-to-acoustical transducer, coupled to a diaphragm, for the purpose of producing audio sound, is disclosed in U.S. Pat. No. 7,038,356, whose teachings are incorporated herein by reference. In one configuration, the transducer amounts to a piezo motor coupled to a diaphragm so that the excursion of the actuator is translated into a corresponding, mechanically amplified excursions of the diaphragm. The diaphragm may be curved and when optically clear, can be mounted on a frame over a visual display to provide an audio speaker. The diaphragm may therefore be characterized by a relatively large, pistonic-equivalent excursion. A typical amplification or mechanical leveraging of the excursion may be five to fifteen fold.

Figure 1:
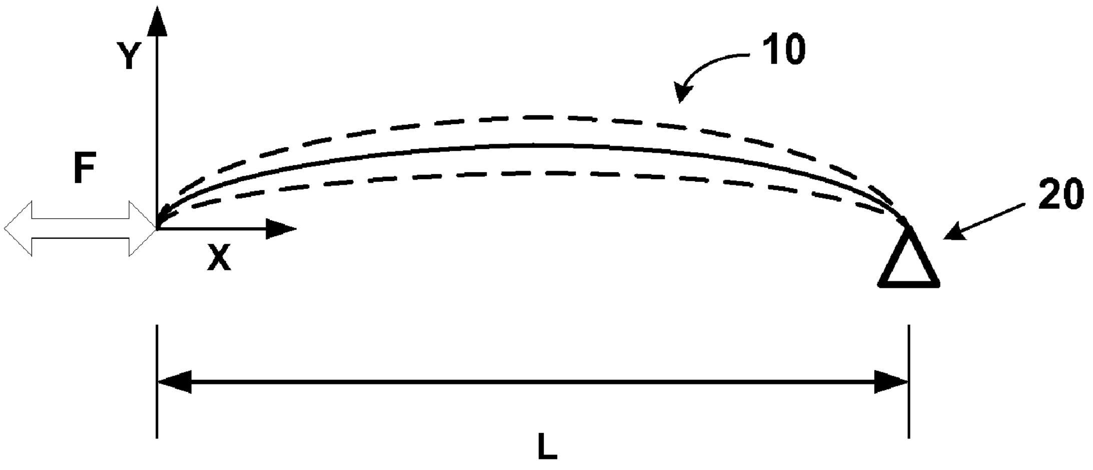
FIG. 1 is an exemplary cross-sectional view illustrating diaphragm flexure.

FIG. 1 is an exemplary cross-sectional view illustrating flexure of a film by application of lateral force F providing lateral motion ("X" axis) and corresponding excursions ("Y" axis). More specifically, the diaphragm 10, which may be biased initially in a curved position, may provide a mechanical disadvantage, allowing relatively small motions ("X" axis) to create a relatively large excursion ("Y" axis). When a force F is applied in alternative directions as shown, the membrane may vibrate up and down, in piston-like fashion, and may then produce sound. It may also be appreciated that the smaller the curvature of the film, the greater the mechanical disadvantage. That is higher force may be required, small "X" travel required and greater "Y" motion may be obtained. It may therefore be appreciated that where space can be an issue (e.g. audio in front of a visual display), a high mechanical disadvantage may be useful since it may be desirable to have the film as flat as possible in a resting position. This may also be useful from the perspective of minimizing optical distortion and reducing aberrant reflections.

Figure 2:
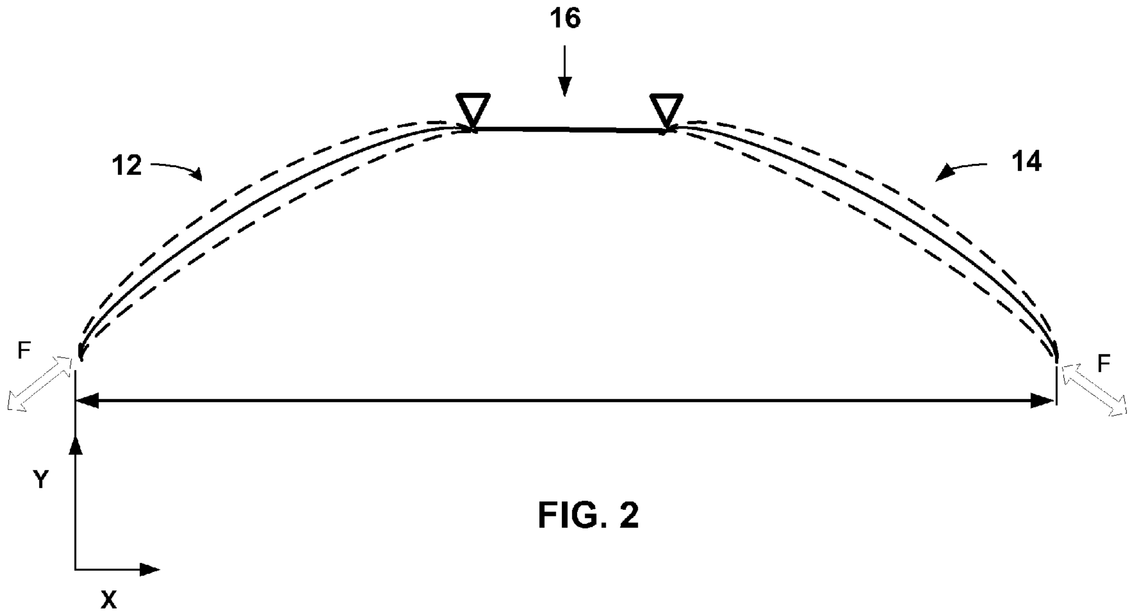
FIG. 2 is an exemplary cross-sectional view illustrating a multi-channel diaphragm speaker.

As illustrated in FIG. 2, for a system that has stereo capability, where two diaphragm channels 12 and 14 may be separated by a relatively inactive zone 16, it may be appreciated that relatively small variations in length L may create a "sagged" membrane or overly taught membrane. Each of these situations may then create unacceptable performance as well as visual distortions (in the case of relatively optically clear diaphragm film). As the diaphragm film is anchored to some structure, it may be appreciated that the film may be susceptible to expansion and contraction of such structure. Accordingly, when the diaphragm may contract or expand due to environmental variations (e.g. heat and/or humidity), and particularly in those situations where it may be attached to a frame that is relatively non-responsive to such environmental conditions, acoustical performance and/or optical clarity may be compromised.

Such effect may be particularly pronounced for a polymeric type material, when heated and/or cooled as such materials may have relatively large coefficients of thermal expansion. That is, compared to other materials, polymeric type materials have relatively high coefficients of linear thermal expansion (CLTE), which may vary from polymer to polymer. The CLTE may be expressed in units of "cm/cm ° C." or "in/in ° F." and in the case of polymeric materials, may fall in the range of 30-170×$10^{-6}$ cm/cm ° C. For example, polycarbonate has a CLTE of about 65×$10^{-6}$ cm/cm ° C. By contrast, steel has a CLTE of about 10×$10^{-6}$ cm/cm ° C., copper having a value of about 16×$10^{-6}$ cm/cm ° C., brass or bronze having a value of about 18×$10^{-6}$ cm/cm ° C. and aluminum having a value of about 22×$10^{-6}$ cm/cm ° C. Accordingly, by way of example, for a 13.0 cm in length polymeric membrane, having a CLTE of 65×$10^{-6}$ cm/cm ° C., a change in temperature of about 5° C. would lead to a 4.22×$10^{-3}$ cm increase in length. Depending on the initial curvature of the film diaphragm when supported in a frame, this may then lead to a sagging or tightening of about 4.2×$10^{-2}$ cm.

Figure 3:
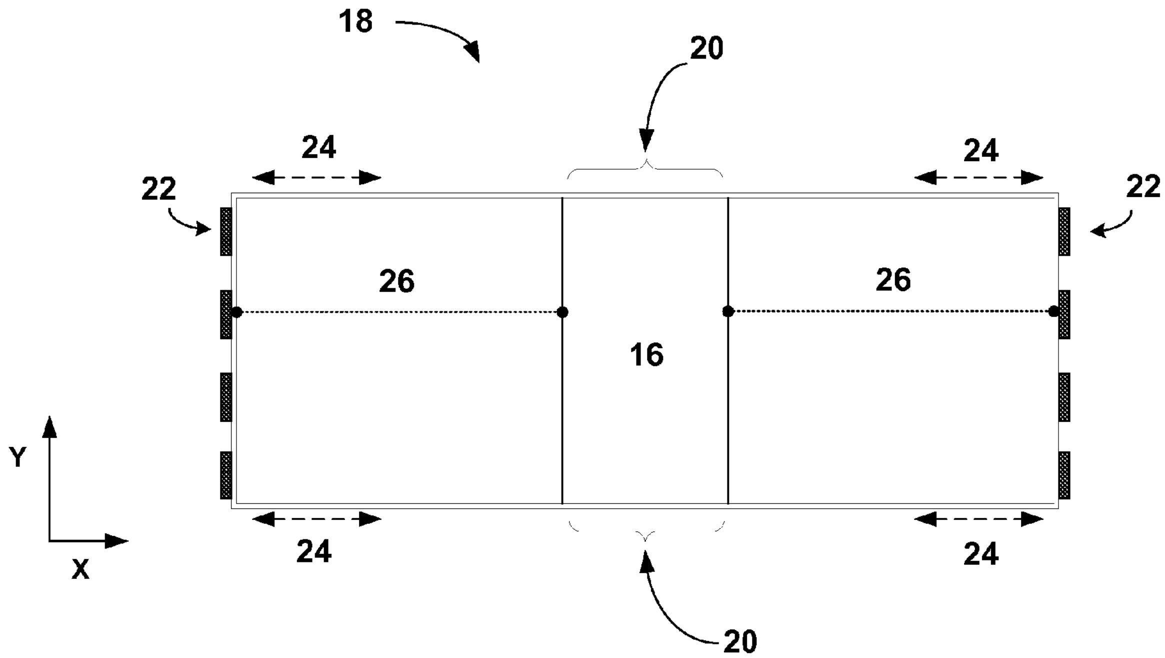
FIG. 3 is an exemplary planar view illustrating one type of a compliant acoustic frame.

In a first exemplary embodiment, and as shown in planar view in FIG. 3, an acoustic frame 18 may be provided that initially provides center attachment points that are shown generally at location 20. Such attachment points may be provided in order to rigidly attach or support the diaphragm at such location to all or a portion of the top and bottom horizontal cross bars, so that relatively discrete audio channels may develop. Accordingly, a frame herein may be more generally understood to apply to any structure that provides the ability to support all or a portion of one side of the diaphragm and all or a portion of the actuators that may then be positioned on another side of the diaphragm. In addition, while FIG. 3 illustrates what may be understood as a two-channel stereo type system, it may be appreciated that the invention herein applies equally to single (mono) or even multi-channel systems (i.e. systems containing 3, 4, 5, even higher numbers of separate audio channels).

Actuators such as a piezo assembly are shown generally at 22. The frame may be formed from metal or other type of material that may therefore provide relatively high stiffness and little or no lost motion in the "X" direction when the actuator forces are applied. The frame may be configured such that it provides environmental compensation. That is, the frame may be configured such that that it may undergo environmental expansion/contraction such as thermal expansion, similar to the amount of thermal expansion/contraction experienced by the diaphragm.

For example, the frame may be designed to undergo the same relative amount of thermal expansion or contraction as any sort of given supporting surface, wherein the supporting surface may be a material that is similar to that of the diaphragm. It is therefore contemplated herein that the frame may accommodate and may then balance any relative differences in dimensional changes that may take place as between the polymeric membrane and a supporting surface, which relative differences in dimensional changes may take place due to environmental factors such as heat, humidity, etc. In addition, the frame may respond to heat that may be generated by operation of the subject speaker as well as surrounding electronic components (e.g. heat emitting amplifiers, etc.).

Figure 4:
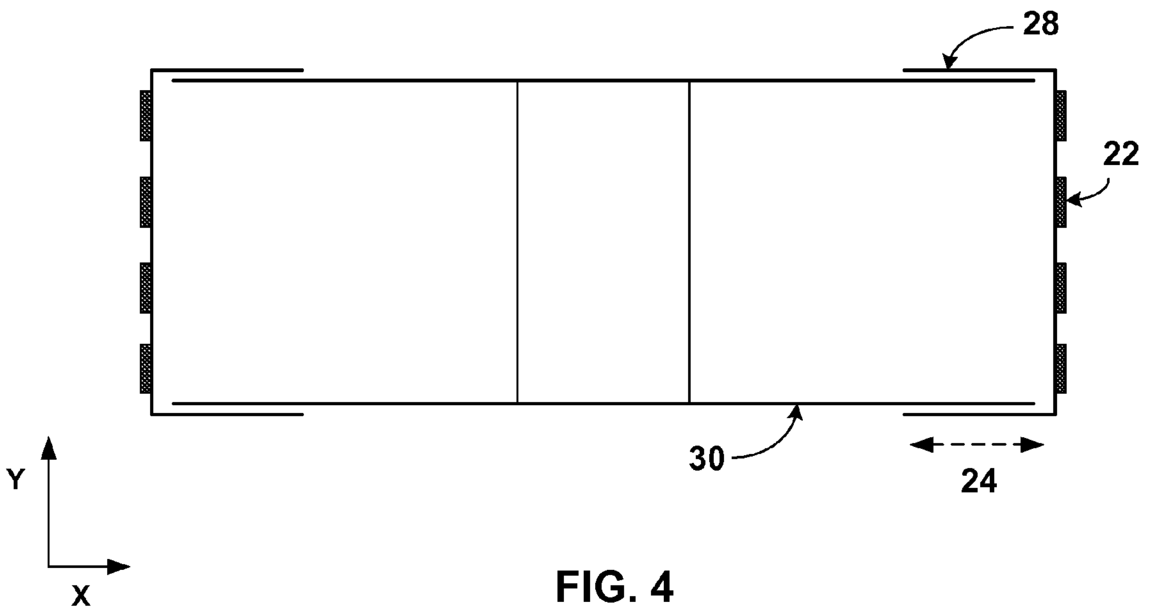
FIG. 4 is another exemplary planar view illustrating another type of compliant acoustic frame.

In such fashion it may be appreciated that the any intended geometry (e.g. some degree of curvature) or nominal or starting distance assumed by the audio generating and moveable diaphragm, as shown generally by line 26 in FIG. 3, may be substantially preserved. With attention next directed to FIG. 4, it may be observed that the frame may include end portions 28, which may be rigidly attached to a given supporting surface. In addition, the frame may include section 30 that may be slidably engaged with end portions 28. Accordingly, should environmental conditions (e.g. thermal conditions) result in an expansion of the polymeric diaphragm, the end portions 28, attached to, e.g. some underlying plastic supporting structure, will also experience the same relative corresponding movement so that any sagging that may otherwise have occurred in the diaphragm may be reduced or substantially eliminated. Similarly, in the event that the polymeric diaphragm undergoes some level of contraction, the underlying supporting structure would experience the same approximate contraction response and the frame may then again serve to compensate and balance such relative motion.

Another exemplary structure and method for compensating for relative movement as between the membrane and an attached supporting surface may be achieved should one mount the piezo assembly 22 to a frame structure that has all or a portion thereof formed from material having similar CLTE properties as the polymeric material utilized for the diaphragm. For example, for a given frame, the frame may include polymeric type material, similar to that of the membrane, that extends in the same direction as the membrane (i.e., upper and lower horizontal sections that extend between the vertical sections, wherein the vertical sections support the piezo assembly, as shown in FIG. 3). Accordingly, the CLTE of the polymeric frame structure may be 25-150% of the value of the CLTE value of the polymeric film membrane, including all values and increments therein. This may be expressed by the following relationship:

$$CLTE_{Diaphragm}=(0.25\text{-}1.5)\ CLTE_{Frame\ Portion}$$

It may therefore be appreciated that in this exemplary embodiment, the piezo assembly itself may be mounted to plastic (polymeric) frame structure which polymer material may be similar or the same at the polymeric material employed for the diaphragm (e.g. a polycarbonate diaphragm with polycarbonate utilized for all or a portion of the frame). In addition, it may be appreciated that by attaching, e.g., the polycarbonate horizontal components of the frame only along a portion of its length to a supporting surface, such polycarbonate components may generally respond to temperature in a manner similar to the polycarbonate diaphragm, thereby reducing those distortion in the diaphragm due to fluctuating ambient thermal conditions. In such configuration, the frame may include vertical sections, supporting the actuators, that may be formed from metallic material that may then not be connected to a supporting surface. In addition, that portion of the frame supporting the actuators may be selectively connected to a supporting surface that has a CLTE that is 25-150% of the CLTE of the diaphragm.

Figure 5:
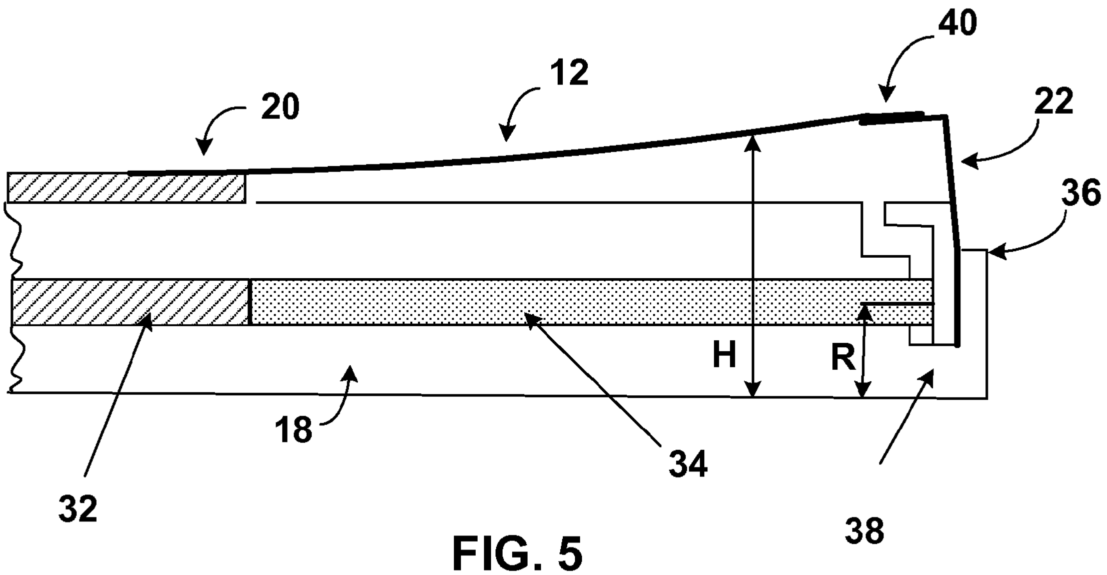
FIG. 5 is a cross-section view illustrating a portion of yet another type of compliant acoustic frame.

Still a further example of providing some level of thermal compensation leads to the use of an environmental compensation bar component which may be installed within the frame periphery. FIG. 5. illustrates in cross-section a portion of the frame periphery and as shown the frame may include an anchor section 32 that may be attached to one end of an environmental compensation component 34. Accordingly, such component 34 may be understood as any component that is responsive to environmental conditions and which will undergo expansion and/or contraction in a manner that may be related to corresponding changes in dimensions of the diaphragm component, as discussed more fully below. As illustrated, the compensation component 34, similar to the diaphragm 12, may then be engaged at another end to communication to the piezo assembly 22.

The diaphragm is again illustrated as attached or anchored at region 20. The compensation component may be composed of a polymeric material that has a CLTE that may again be 25-150% of the value of the CLTE of the membrane 12. The piezo is shown again at 22 and the piezo attachment area is shown generally at 36. As may now be appreciated, the frame, and hence the piezo may be designed such that they are capable of pivoting at region 38, depending upon the forces ultimately acting on the piezo through the frame by the compensation bar component 34. The compensation bar is therefore itself capable of mechanically engaging with a portion of the frame which ultimately may engage the piezo in order to communicate all or a portion of any corresponding dimensional changes it may experience, and the diaphragm is specifically illustrated as attached to the piezo at diaphragm attachment location 40.

Accordingly, when the diaphragm 12 may expand or contract due to temperature variations, the compensation bar component may similarly expand or contract and the entire piezo clamp area around pivot location 38 in turn may accommodate the various dimensional changes occurring in the diaphragm due to temperature. Moreover, it may be appreciated that if the compensation bar 34 has substantially the same relative CLTE as the diaphragm, the attachment point of the compensation bar 34 may be at or near the full height of the piezo 22 (i.e. in FIG. 5, R=H). If the compensation bar has a lower CLTE than the diaphragm, the compensation bar may be in a relatively lower position, as shown in FIG. 5 (R=0.4H). Accordingly, any differential expansion in the compensation bar 34, the diaphragm 12 and the frame 18 may now be evaluated and balanced to avoid any substantial loss in acoustic performance.

Figure 6:
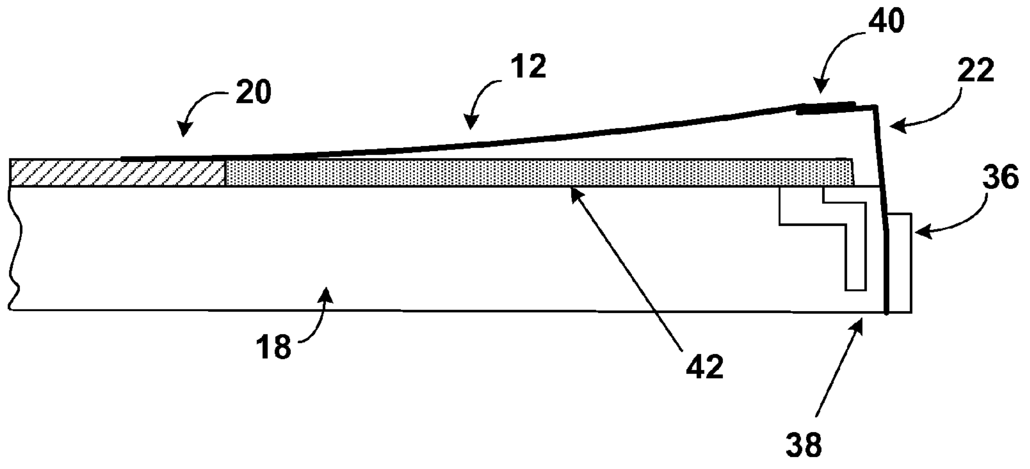
FIG. 6 is cross-sectional view of a still further type of compliant acoustic frame.

Attention is next directed to FIG. 6 which provides another cross-sectional view of the frame 18. In this exemplary embodiment, the diaphragm may again be attached or anchored to the frame at region 20 and in addition, a sheet of material 42, preferably the same material as that of the diaphragm (i.e., the sheet is preferably optically clear) may be similarly anchored at region 20 while extending below the diaphragm to the piezo assembly 22. This additional and underlying sheet of material 42 may then, as illustrated, be separately attached or otherwise mechanically engaged to the frame and hence the piezo assembly. This additional sheet of material may also be designed so that it has sufficient rigidity so that it may interact with the piezo in a manner similar to the compensation bar 34 noted above. That is, should the diaphragm 12 undergo a dimensional change due to environmental conditions (heat and/or humidity) the sheet of material 42 may similarly expand or contract and mechanically engage with the piezo in order to similarly communicate all or a portion of any corresponding dimensional changes it may experience to the piezo. In that manner the piezo 22 may again be made to pivot at general pivot location 38 to thereby accommodate any sag or tension developed in the diaphragm from a given nominal configuration. Again, it should be understood that such a nominal configuration may include a desired dimension or geometry in the diaphragm as between diaphragm attachment location 20 and that location where the diaphragm is attached to the piezo assembly 22.

Figure 7:
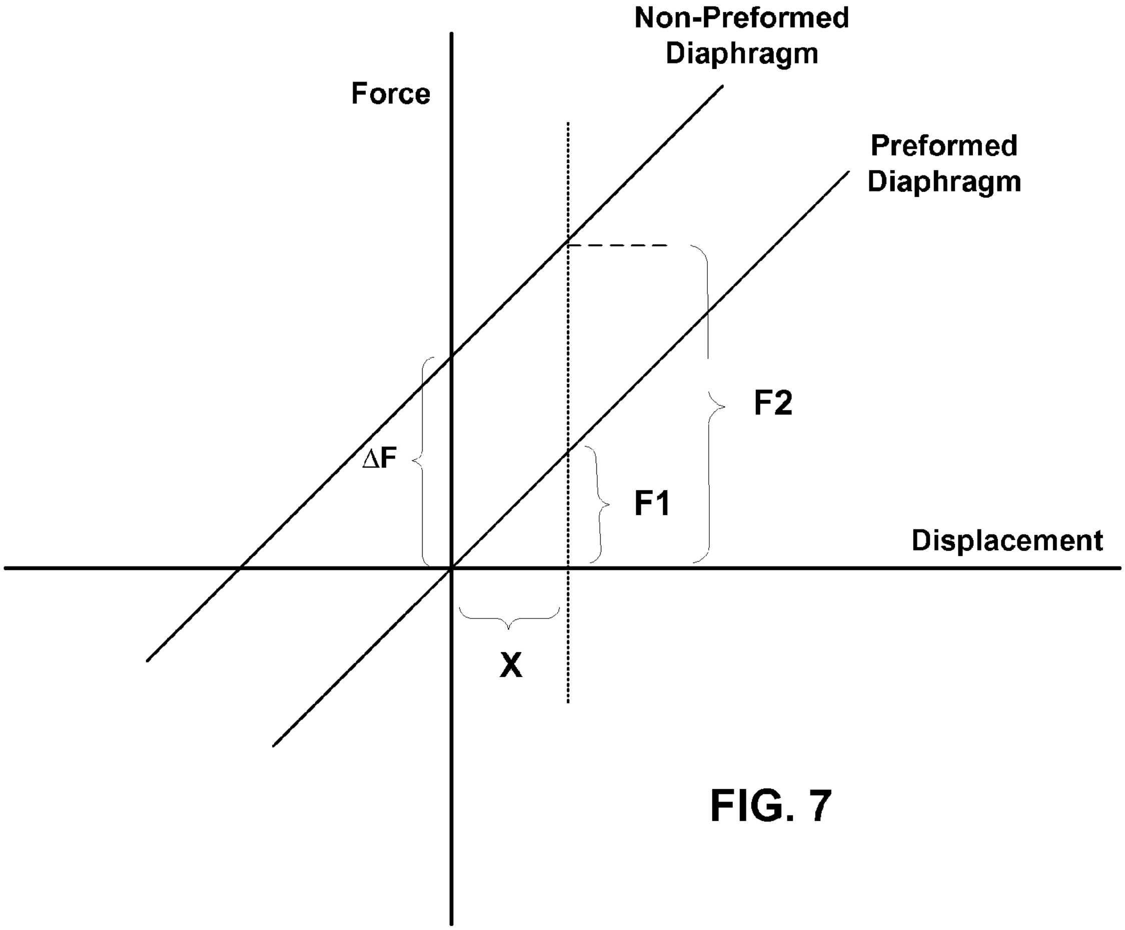
FIG. 7 is force vs. displacement plot of a non-preformed diaphragm vs. a preformed curved diaphragm.

In addition, as alluded to above, it can be observed in FIGS. 1, 2, 5 and 6 that diaphragms 10, 12 and/or 14 may all preferably be curved (either convex or concave) with the actuator attached at any point or location along one edge thereof. Exemplary and non-limiting examples of such diaphragm material include polymeric materials such as polycarbonate, poly-4-methyl-1-pentene (TPX®), acrylic type resins (PMMA), cellulosic material include cellulose acetate (CA) and/or cellulose acetate-butyrate (CAB), polyimides such as polyamideimides (KAPTON®) or polyetherimides (ULTEM®), polysulphones, etc. The diaphragm may also be sourced from tempered glass or metallic material such as titanium. Moreover, it may be advantageous to provide a diaphragm that is preformed with a desired curvature wherein a polymeric resin may be exposed to a given temperature (e.g. Tg and/or Tm) wherein the desired geometry is formed into the material and such form remains at operating (e.g., room) temperature. Such heat treatment may be provided by thermoforming a sheet of polymeric film, compression molding to a desired curvature, powder casting, casting of a plastisol and/or organosol, or even injection molding. The curvature may specifically contemplate one-half of a sine wave. It may therefore be appreciated that in such fashion the nominal geometry for the diaphragm may be curved, thereby relieving the piezos from supplying a force to maintain curvature. In such manner, the force/power that may be required to create a desired membrane excursion (i.e. sound) may be reduced. FIG. 7 illustrates a force vs. displacement plot of a non-preformed diaphragm whose curved initial nominal position must be maintained by the piezo actuator vs. a preformed curved diaphragm. As can be seen the amount of force necessary to displace the non-preformed diaphragm exceeds the amount of force necessary to displace the preformed and curved diaphragm a given amount.

Figure 8:
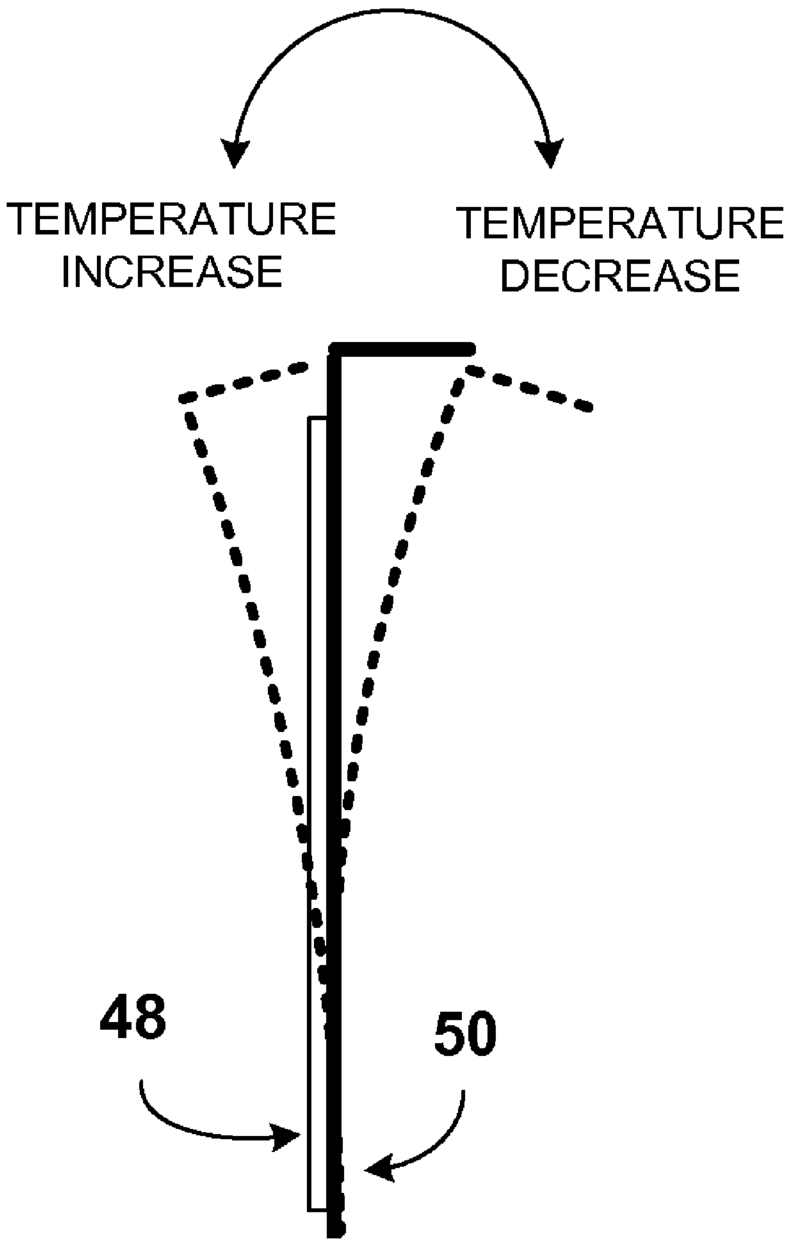
FIG. 8 illustrates a piezo actuator that may itself be configured to respond to temperature and accommodate changes in dimension of any given diaphragm material.

The present invention also provides compensation for changes in dimensions of the diaphragm due to environmental conditions, by providing for changes in the piezo design itself. For example, with attention to FIG. 8, by selecting and controlling the thickness and/or materials for the piezo, it may be designed such that it may flex or bend as shown depending upon temperature. For example, one may control the thickness of the piezo ceramic material 48 or metal substrate 50, which metal substrate may then attach to the diaphragm. One may also add materials to the piezo (e.g. another layer of metal on the substrate) to develop a bimetallic spring that is responsive to temperature due to differences in CLTE for the different metals. In FIG. 8, upon temperature increase the actuator may then bend away from the membrane and assume all or a portion of any increase in dimension that may have taken place in the diaphragm material. In related manner, in the event of a temperature increase, the piezo actuator may be designed to bend towards the diaphragm, and compensate for all or a portion of any contraction that may have taken place in the diaphragm due to a temperature reduction.

In addition, the invention herein contemplates what may be described as active compensation. For example, the piezo actuator may be designed to oscillate around a DC offset in order to restore the diaphragm to a nominal position and compensation for any thermal expansion and/or contraction. In such a configuration, temperature may be sensed at or near the diaphragm and the active compensation may then be initiated through a look-up-table (LUT) that may be stored in memory on an attached microprocessor. Such LUT may include information regarding the diaphragm, its dimensions, and CLTE response at any given temperature. Accordingly, the piezo may again similarly be made to undergo the exemplary configuration changes illustrated in FIG. 8 in response to changing temperature conditions, and compensation for diaphragm expansion and/or contraction.

The foregoing description is provided to illustrate and explain the present invention. However, the description hereinabove should not be considered to limit the scope of the invention set forth in the claims appended here to.

What is claimed is:

1. An acoustic transducer capable of converting mechanical motion into acoustical energy comprising:

a diaphragm;

a support on one portion of said diaphragm including an actuator operatively coupled to a second portion of said diaphragm wherein said support and actuator are separated by a distance and are capable of relative motion to adjust said distance.

2. The acoustic transducer of claim 1 wherein said support and actuator are capable of relative motion in response to temperature.

3. The acoustic transducer of claim 1, wherein said support and actuator are located on a frame, and said frame is capable of providing relative motion to adjust said distance between said actuator and said support.

4. The acoustic transducer of claim 3 wherein said frame is mounted to a sub-structure structure wherein said sub-structure is formed from a material with a CLTE that is capable of controlling said distance between said support and actuator.

5. The acoustic transducer of claim 4 wherein said diaphragm has a CLTE and said CLTE of said substructure is 0.25-1.50 of the CLTE of said diaphragm.

6. The acoustic transducer of claim 3 wherein said diaphragm has a CLTE and any portion of the frame as between the actuator and the support includes a material that has a CLTE that is 0.25-1.50 of said diaphragm CLTE.

7. The frame of claim 3 wherein said frame comprises two sections, wherein one section including said support is slidably engaged to a second section including said actuator.

8. The acoustic transducer of claim 3 wherein said frame has a CLTE that is 25-150% of the CLTE of the diaphragm.

9. The acoustic transducer of claim 1 including a component engaged to said support and said actuator, wherein said component is capable of expanding and/or contracting due to temperature to adjust said distance of said membrane between said support and said actuator.

10. The acoustic transducer of claim 9 wherein said component engaged to said support and said component is capable of moving said actuator and adjusting said distance of said membrane between said support and said actuator.

11. The acoustic transducer of claim 1 wherein said support overlies a video screen and said diaphragm is spaced from said video screen.

12. The acoustic transducer of claim 1 wherein said actuator is capable of bending in response to temperature to adjust said distance as between said diaphragm and said support.

13. A method for compensating for environmental conditions in a transducer capable of converting mechanical motion into acoustical energy comprising:

supplying a transducer including a diaphragm and a support on one portion of said diaphragm including an actuator operatively coupled to a second portion of said diaphragm wherein said support and actuator are separated by a distance;

wherein said transducer is exposed to changes in temperature and adjusts said distance between said support and said actuator.

14. The method of claim 13 wherein said support is positioned over a video screen.

15. The method of claim 13 wherein said distance between said support and said actuator is adjusted by pivoting of said actuator.

* * * * *

UNITED STATES PATENT AND TRADEMARK OFFICE

CERTIFICATE OF CORRECTION

PATENT NO. : 7,884,529 B2
APPLICATION NO. : 11/421335
DATED : February 8, 2011
INVENTOR(S) : Kevin M. Johnson et al.

It is certified that error appears in the above-identified patent and that said Letters Patent is hereby corrected as shown below:

In column 7, line 9, in Claim 4, after "sub-structure" delete "structure".

In column 7, line 13, in Claim 5, delete "substructure" and insert -- sub-structure --, therefor.

Signed and Sealed this
Fourteenth Day of June, 2011

David J. Kappos
*Director of the United States Patent and Trademark Office*